(12) United States Patent
Ishii et al.

(10) Patent No.: US 9,036,897 B2
(45) Date of Patent: May 19, 2015

(54) STORAGE MEDIUM STORING COMPUTER PROGRAM FOR DETERMINING AT LEAST ONE OF EXPOSURE CONDITION AND MASK PATTERN

(75) Inventors: Hiroyuki Ishii, Shioya-gun (JP); Yuichi Gyoda, Utsunomiya (JP); Koji Mikami, Nikko (JP); Kouichirou Tsujita, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 152 days.

(21) Appl. No.: 13/032,960

(22) Filed: Feb. 23, 2011

(65) Prior Publication Data
US 2011/0206270 A1 Aug. 25, 2011

(30) Foreign Application Priority Data
Feb. 24, 2010 (JP) ................. 2010-039071

(51) Int. Cl.
*G06K 9/00* (2006.01)
*G03F 7/20* (2006.01)

(52) U.S. Cl.
CPC ............ *G03F 7/709* (2013.01); *G03F 7/70091* (2013.01); *G03F 7/70358* (2013.01); *G03F 7/705* (2013.01); *G03F 7/70525* (2013.01)

(58) Field of Classification Search
USPC .............................. 382/144, 145, 151; 348/16
See application file for complete search history.

(56) References Cited

U.S. PATENT DOCUMENTS 5,486,896 A * 1/1996 Hazama et al. ................ 355/71
6,154,563 A * 11/2000 Tsudaka ....................... 382/144
6,285,437 B1 * 9/2001 Tokunaga ..................... 355/53
6,472,673 B1 * 10/2002 Chalupka et al. ........ 250/492.22
6,753,948 B2 * 6/2004 Taniguchi .................... 355/71
2002/0111038 A1 * 8/2002 Matsumoto et al. .......... 438/763
2002/0145713 A1 * 10/2002 Kurosawa ..................... 355/53
2003/0170552 A1 * 9/2003 Miyashita et al. ............ 430/30
2003/0215965 A1 * 11/2003 Grodnensky et al. ......... 438/16
2007/0046921 A1 * 3/2007 Takahashi et al. ............ 355/71
2007/0097355 A1 * 5/2007 Shiode ........................ 356/124
2009/0009741 A1 * 1/2009 Okita et al. ................... 355/53
2009/0310116 A1 12/2009 Tsujita

FOREIGN PATENT DOCUMENTS

| EP | 2133745 A1 | 12/2009 |
|---|---|---|
| JP | 2000-260692 A | 9/2000 |
| JP | 2007-036100 A | 2/2007 |
| JP | 2009-302206 A | 12/2009 |
| WO | 2005/083756 A | 9/2005 |

\* cited by examiner

*Primary Examiner* — Kim Vu
*Assistant Examiner* — Michael Vanchy, Jr.
(74) *Attorney, Agent, or Firm* — Canon USA, Inc. IP Division (57) ABSTRACT

A computer readable storage medium is provided, storing a computer-executable program for causing a computer to determine at least one of mask pattern and exposure condition of an exposure apparatus having an illumination optical system for illuminating a mask with light from a light source and a projection optical system for projecting the mask pattern onto a substrate. The program causes the computer to perform calculation of an image of a pattern on an object plane of the projection optical system using information about lateral shift of an image caused by the exposure apparatus, and determination of at least one of the exposure condition and the mask pattern based on a calculation result.

12 Claims, 10 Drawing Sheets

STORAGE MEDIUM STORING COMPUTER PROGRAM FOR DETERMINING AT LEAST ONE OF EXPOSURE CONDITION AND MASK PATTERN

BACKGROUND OF THE INVENTION

1. Field of the Invention

The present invention relates to a storage medium storing a computer program for determining at least one of exposure condition and mask pattern.

2. Description of the Related Art

In recent years, semiconductor devices have been miniaturized, which makes it more difficult to transfer (resolve) patterns in exposure apparatuses. Accordingly, the exposure apparatuses utilize super resolution technology such as off-axis illumination and optical proximity correction (OPC) to adapt to the miniaturization of semiconductor devices, and optimize a mask pattern or a shape of effective light source that illuminates masks. Japanese Patent Application Laid-Open No. 2009-302206 discusses a method of determining exposure conditions in view of either or both of exposure amount and defocus to acquire a desired image during exposure process.

In an exposure apparatus, each stage that supports a mask or substrate desirably stays at a predetermined position, but is known to be vibrating around the position with a slight amplitude in a cycle similar to or shorter than an exposure period. The vibration is likely to occur in each of the x, y, and z directions, where the z direction corresponds to an optical axis direction of a projection optical system, and the x and y directions are perpendicular to the z direction and correspond to the directions in which a stage moves. In a scanning exposure, a mask stage and a substrate stage ideally synchronize with each other during scanning, but practically they are a little bit out of synchronization. The vibration and asynchrony of the stages can be referred to as moving standard deviation (MSD).

When MSD occurs, while a single point on a substrate is exposed, a image is formed laterally shifted, or the plurality of laterally shift images are superimposed upon one another, which makes the resulting images, such as resist images (latent images) on a wafer, blurred. In addition, in the case where a projection optical system causes distortion, a plurality of images are formed laterally shifted and superimposed upon one another in scanning exposure, forming blurred images, as in the case of MSD.

The inventor of the present invention found that MSD often considerably affects the shapes of resulting images. In the prior art, however, no consideration is given to the effect of MSD onto the lateral shift of images in the methods of determining exposure conditions and mask patterns. Consequently, exposures based on the exposure conditions or mask patterns that are obtained only by optimization calculations do not provide adequate images as expected.

SUMMARY OF THE INVENTION

According to an aspect of the present invention, a computer readable storage medium is provided, storing a computer-executable program for causing a computer to determine at least one of mask pattern and exposure condition of an exposure apparatus having an illumination optical system for illuminating a mask with light from a light source and a projection optical system for projecting the mask pattern onto a substrate. The program causes the computer to perform calculation of an image of a pattern on an object plane of the projection optical system using information about lateral shift of an image caused by the exposure apparatus, and determination of at least one of the exposure condition and the mask pattern based on a calculation result.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the invention.

DESCRIPTION OF THE EMBODIMENTS

Various exemplary embodiments, features, and aspects of the invention will be described in detail below with reference to the drawings.

A first exemplary embodiment according to the present invention is described. An exposure apparatus includes an illumination optical system for illuminating a mask with light from a light source, and a projection optical system for projecting an image pattern of the mask onto each substrate.

In a first exemplary embodiment, for an exposure in an exposure apparatus that causes MSD, an appropriate shape of an effective light source and an appropriate mask pattern can be obtained by calculations.

In the present exemplary embodiment, an argon fluoride (ArF) excimer laser (wavelength: 193 nm) is used as a projection light source, and the projection optical system has a numerical aperture (NA) of 0.93.

Figure 1:
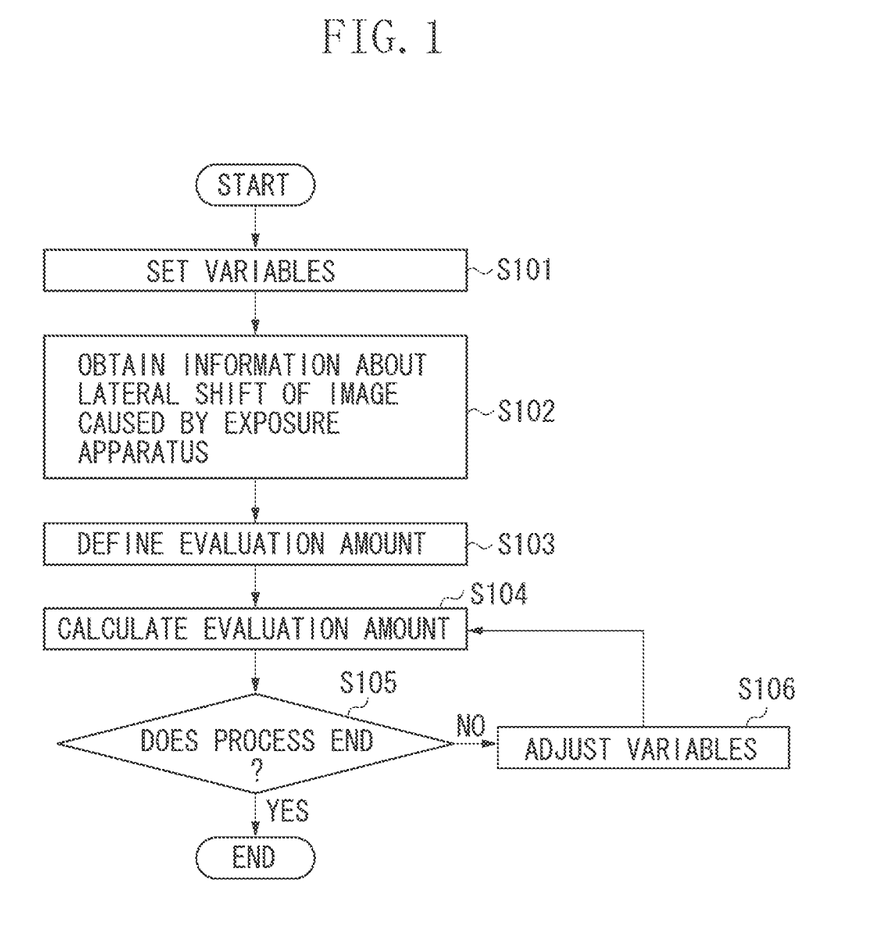
FIG. 1 is a flowchart illustrating a determination process of a first exemplary embodiment according to the present invention.

FIG. 1 is a flowchart illustrating a process of determining exposure condition and mask pattern. The determination method determines (optimizes) at least one mask pattern and exposure condition of an exposure apparatus. For example, the determination method is realized by a program that implements each step of the flowchart. The program is provided, via a network or from a storage medium, to a computer that serves as an information processing apparatus. When the information processing apparatus reads and executes the program, the process is realized. The program may be stored in a storage medium such as a memory. In this case, the information processing apparatus reads the program from the storage medium to realize the process.

Aspects of the present invention can also be realized by a computer of a system or apparatus (or devices such as a CPU or MPU) that reads out and executes a program recorded on a memory device to perform the functions of the above-described embodiment(s), and by a method for performing steps by a computer of a system or apparatus by, for example, reading out and executing a program recorded on a memory device to perform the functions of the above-described embodiment(s). For this purpose, the program is provided to the computer, for example, via a network or from a recording medium of various types serving as the memory device (e.g., computer-readable medium).

The determining method is described according to the flowchart.

Figure 2:
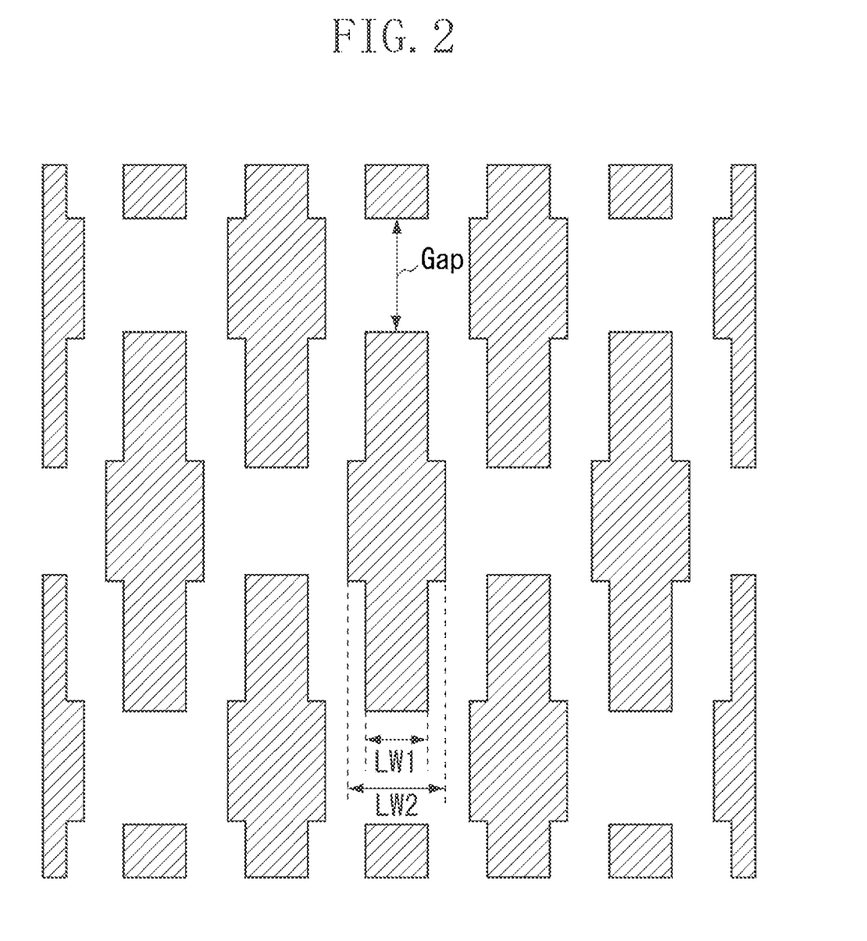
FIG. 2 illustrates a mask pattern of the first exemplary embodiment according to the present invention.
Figure 3:
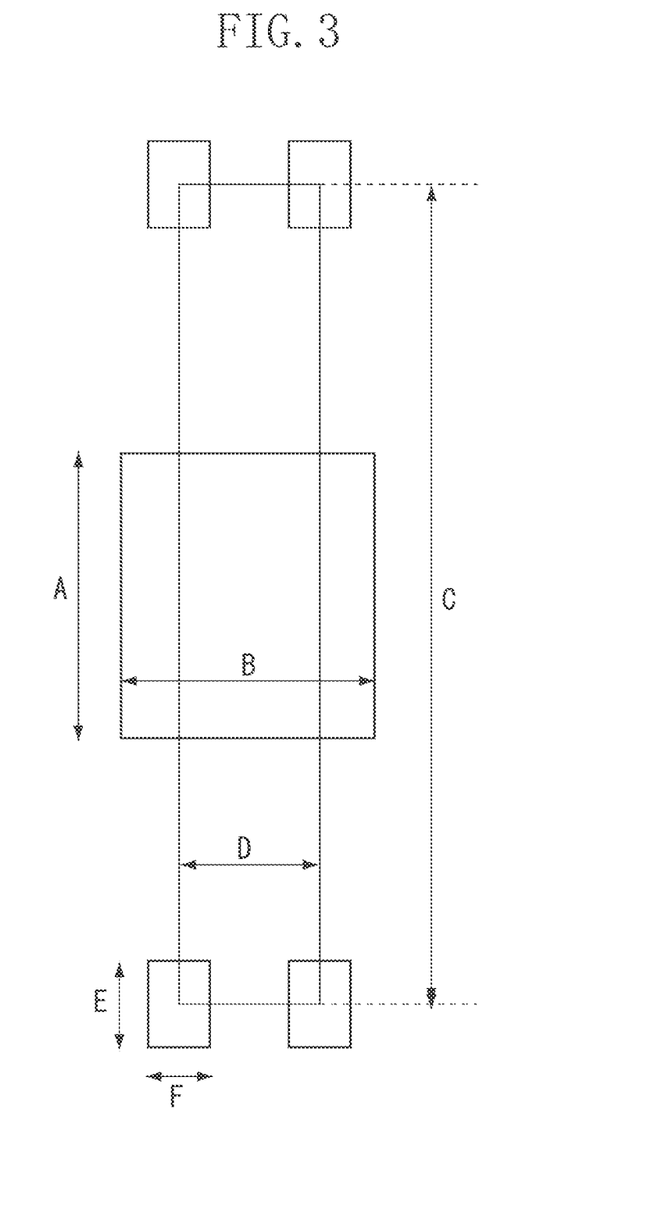
FIG. 3 illustrates mask pattern parameters used to represent a mask pattern as a function thereof.
Figure 4:
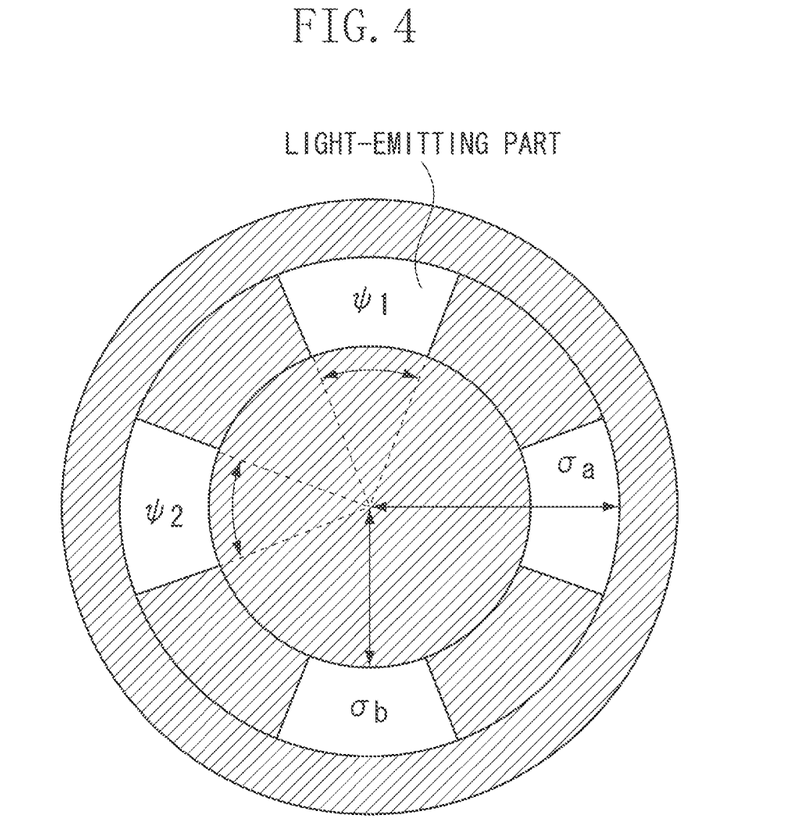
FIG. 4 illustrates parameters of effective light source shape used to represent a shape of effective light source as a function thereof.

In step S101, variables are set. FIG. 2 illustrates an example of mask pattern for memory cells in a dynamic random access memory (DRAM). The dimension of the mask pattern and the shape of effective light source are adjusted so that mask pattern images each have line widths LW1 and LW2 and are arranged at an interval Gap in the longitudinal direction as desired. The distribution of the effective light source (illumination shape) corresponds to light intensity distribution on the pupil plane of an illumination optical system, and also corresponds to the angular distribution of light that illuminates the mask. The mask pattern is represented as a function of six parameters for lengths A, B, C, D, E, and F as illustrated in FIG. 3. In the present exemplary embodiment, a mask pattern is composed of a plurality of polygons, and the lengths of the sides of the polygons are set as the parameters of the mask pattern. The images are arranged at a fixed interval of 130 nm in the X direction and 250 nm in the Y direction. The shape of effective light source is represented as a function of four parameters as illustrated in FIG. 4: angles $\Psi_1$ and $\Psi_2$, an outer sigma value $\sigma_a$, and an inner sigma value $\sigma_b$. The above ten parameters (the parameters for a mask pattern and the parameters for the shape of effective light source) define a parameter space. In the parameter space, each of the pattern parameters and the effective light source parameters is optimized. At first, the parameters are each set to a proper and arbitrary initial value, and are provisionally determined successively based on repeated calculations for the optimization.

In step S102, information about lateral shift of images caused by the exposure apparatus is obtained.

In step S102, the MSD is modeled, and information required for the modeling is obtained. A calculation unit (e.g., central processing unit) of the information processing apparatus may obtain the information from data stored in the memory, or from the outside of the apparatus. The present exemplary embodiment assumes that a substrate stage slightly vibrates in the horizontal x and y directions. A substrate stage vibrates while a single point on a substrate is exposed, which corresponds to the situation where a plurality of stationary images in a position shifted one another is superimposed upon one another. If each existence probability of the stage position in the x and y directions is normal distribution within its standard deviation $\sigma_x$ and $\sigma_y$, respectively, the optical image formed in the presence of micro vibration can be obtained by convolution of an image formed without the micro vibration, with Gaussian function. In the present exemplary embodiment, $\sigma_x=\sigma_y=10$ nm, which is the setting value that defines the magnitude of lateral shift. The $\sigma_x$ value and $\sigma_y$ value may be different from each other. The problem exists in the relative vibration between the support structure of a mask and that of a substrate, or asynchrony of scanning, and thereby it is not necessary actually to distinguish which structure causes the vibration.

In step S103, an evaluation amount is defined. In the present exemplary embodiment, the evaluation amount is defined as the root mean square (RMS) of a shift amount (difference) from target values of LW1, LW2, and Gap under the three exposures at a standard dose of exposure and the standard ±5% dose of exposure. The standard dose of exposure was determined so that LW1 becomes a target dimension. In the present exemplary embodiment, the target value of LW1 is 65 nm, the target value of LW2 is 80 nm, and the target value of Gap is 100 nm.

In step S104, an evaluation amount is calculated. Based on the MSD set in step S102 using the current value of the variable set in step S101, an optical image on the image plane is computed to calculate the evaluation amount set in step S103. More specifically, based on the current variable parameter values A, B, C, D, E, F, $\Psi_1$, $\Psi_2$, $\sigma_a$, and $\sigma_b$, and the MSD values $\sigma_x$ and $\sigma_y$, an image is computed to calculate shift amounts of LW1, LW2, and Gap from the respective target values.

In step S105, it is determined whether the process ends or not. It is determined whether adjustment of variables is completed or not. The criterion for the determination may be derived from a comparison of the calculation result (evaluation amount) to a threshold value, or the number of repeated calculations.

In step S106, the variables are adjusted. The variables may be adjusted randomly using Monte Carlo simulation, or based on a genetic algorithm approach.

Figure 5A:
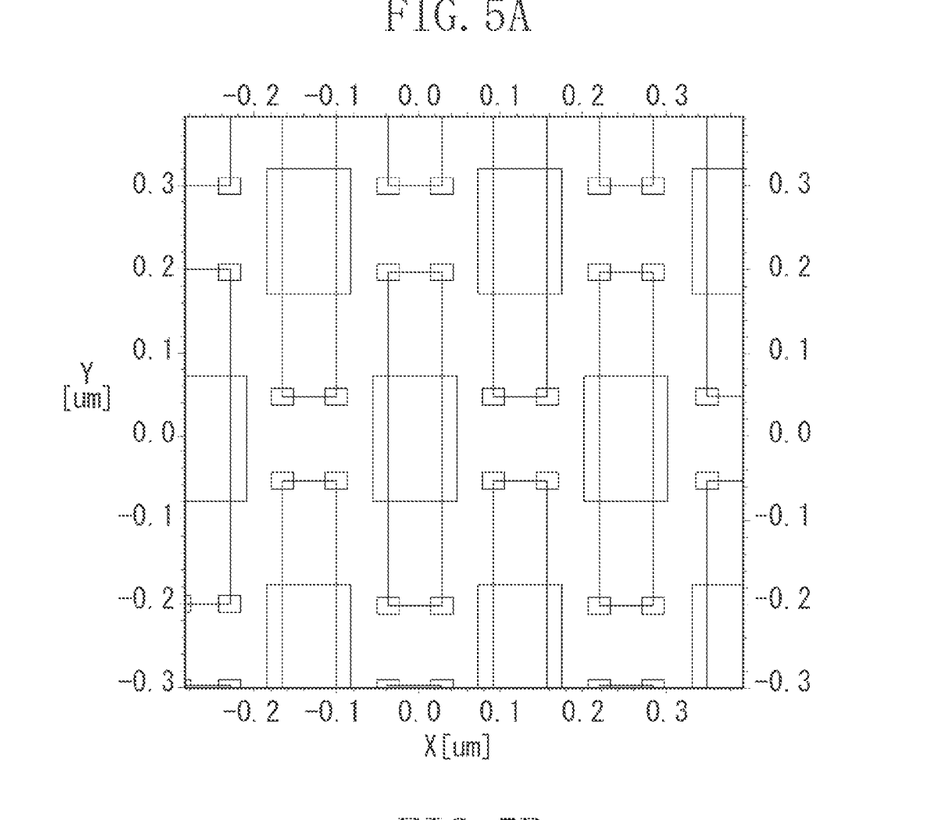
FIG. 5A illustrates an adjustment result of the mask patterns in the first exemplary embodiment.
Figure 5B:
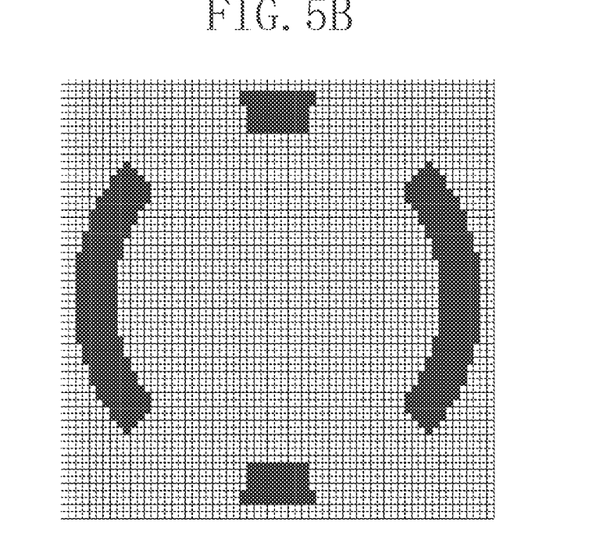
FIG. 5B illustrates an adjustment result of the shape of effective light source in the first exemplary embodiment.
Figure 5C:
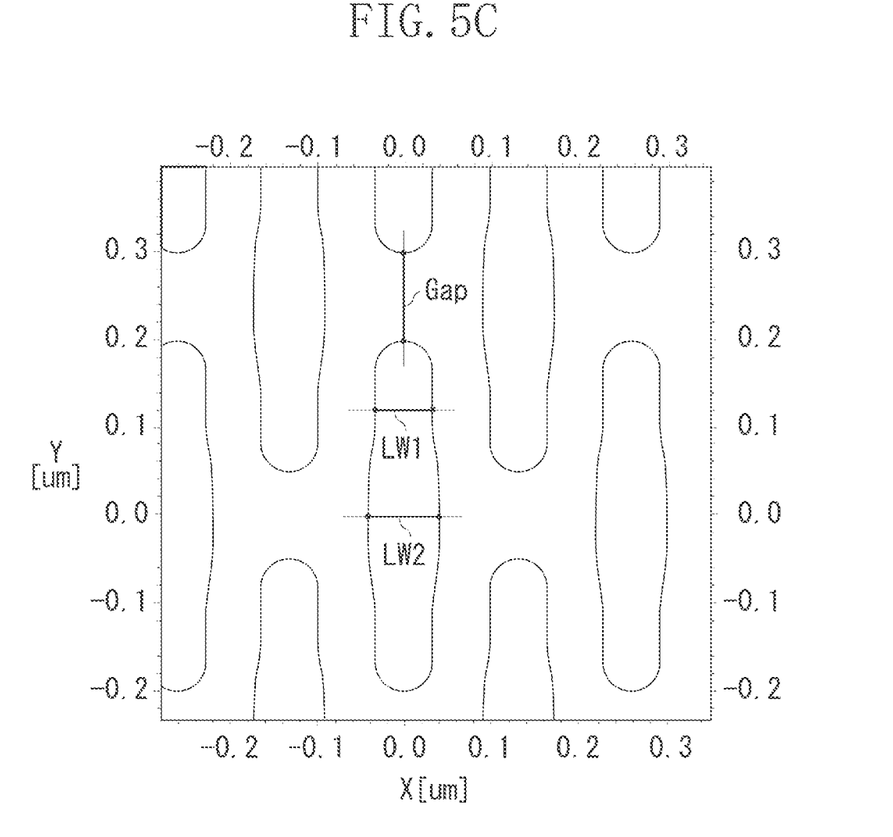
FIG. 5C illustrates an image formed under micro vibrations in the first exemplary embodiment.

The results obtained by the above method are as follows. FIG. 5A illustrates the mask pattern obtained by the method, FIG. 5B illustrates the shape of effective light source obtained by the method, and FIG. 5C illustrates an image obtained with $\sigma_x=\sigma_y=10$ nm. The three lines in FIG. 5C indicate the positions where the values LW1, LW2, and Gap were measured respectively. Table 1 lists the resulting variables after adjustment in the present exemplary embodiment.

TABLE 1

| | | |
|---|---|---|
| $\Psi_1$ | 20.8 | degrees |
| $\Psi_2$ | 81.9 | degrees |
| $\sigma_a$ | 0.94 | |
| $\sigma_b$ | 0.75 | |
| A | 150.6 | nm |
| B | 107.4 | nm |
| C | 400.1 | nm |
| D | 67.1 | nm |
| E | 20.8 | nm |
| F | 27.8 | nm |

In this case where $\sigma_x=\sigma_y=10$ nm, the RMS of an shift amount of evaluated dimensions from the target values under the three exposures at a standard dose of exposure and the standard ±5% dose of exposure was 3.1 nm.

Figure 6A:
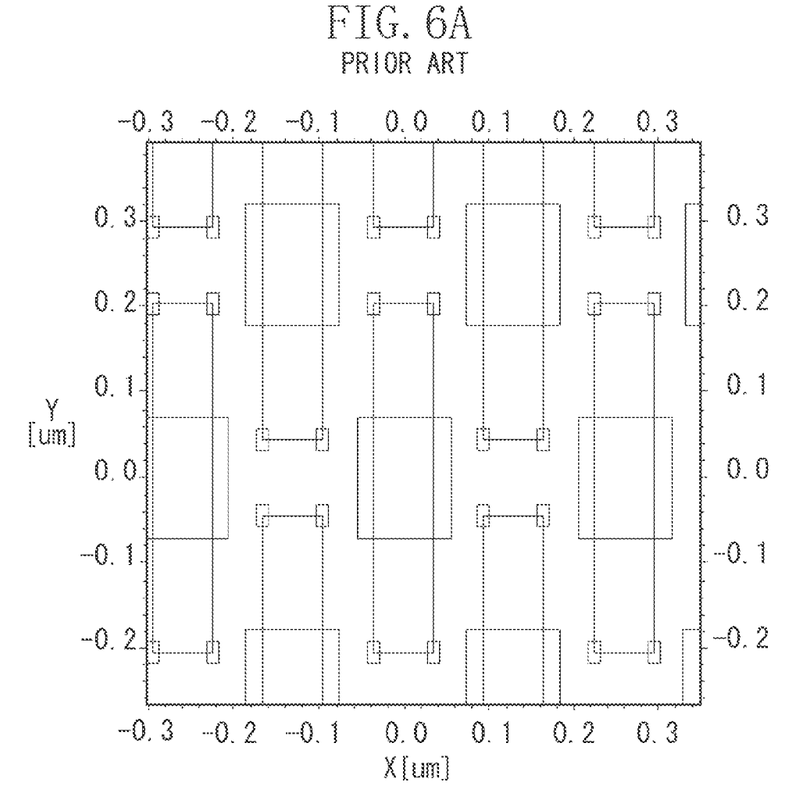
FIG. 6A illustrates a result of adjustment of mask patterns in the prior art.
Figure 6B:
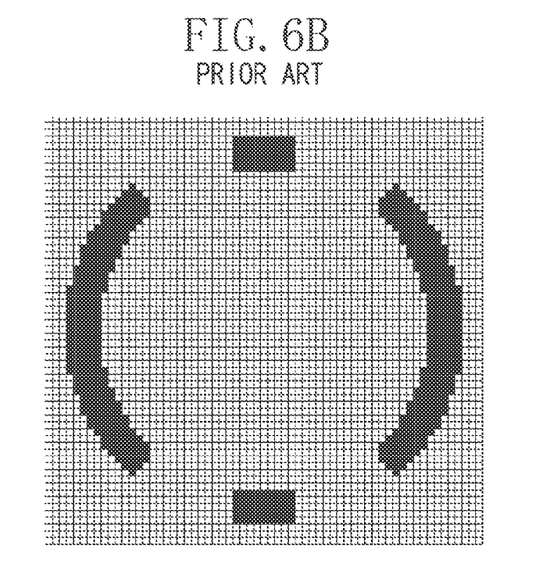
FIG. 6B illustrates an adjustment result of the shape of effective light source in the prior art.
Figure 6C:
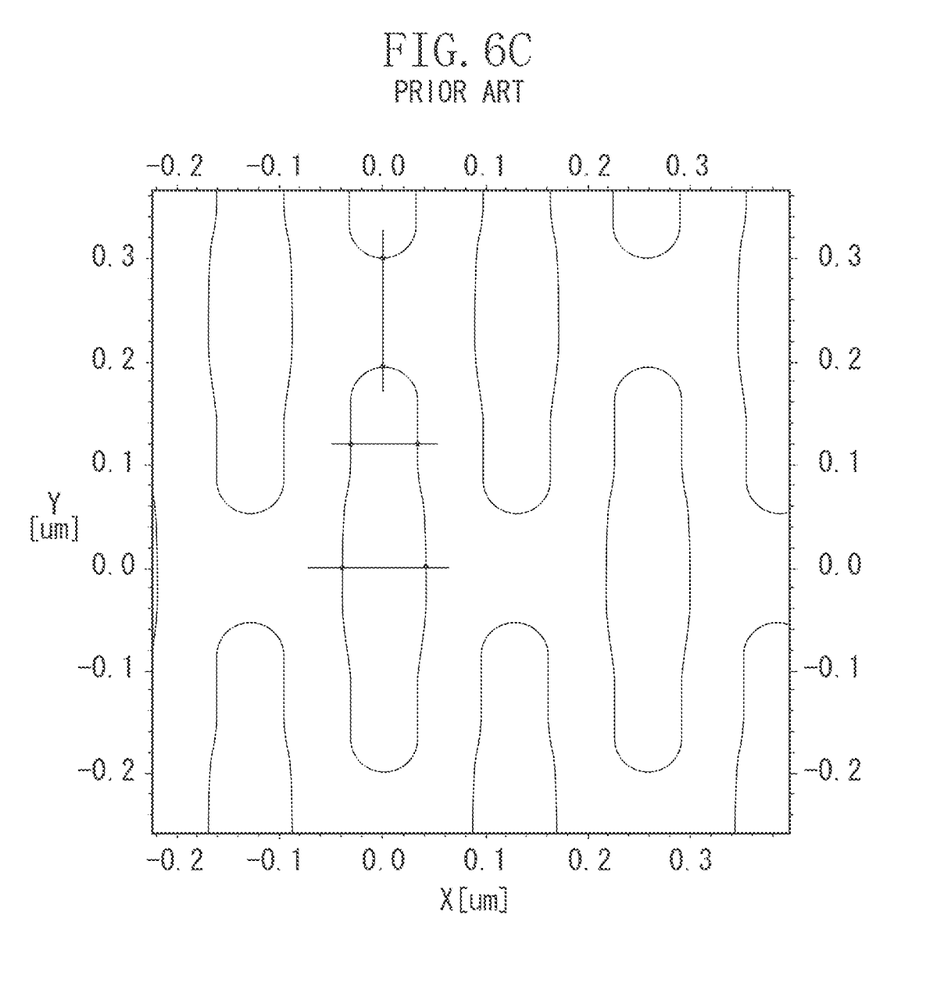
FIG. 6C illustrates an image formed under micro vibrations in the prior art.

As a control example, the variables were adjusted without respect to MSD as in the prior art. FIG. 6A illustrates the mask pattern obtained by the control example, FIG. 6B illustrates the shape of effective light source, and FIG. 6C illustrates an image obtained under standard dose of exposure where $\sigma_x=\sigma_y=10$ nm. Table 2 lists the resulting variables after adjustment. In this case where $\sigma_x=\sigma_y=10$ nm, the RMS of a shift amount of evaluated dimensions from the target values under the three exposures at a standard dose of exposure and the standard ±5% dose of exposure, was 4.2 nm.

TABLE 2

| | | |
|---|---|---|
| $\Psi_1$ | 20.1 | degrees |
| $\Psi_2$ | 96.6 | degrees |
| $\sigma_a$ | 0.91 | |
| $\sigma_b$ | 0.75 | |
| A | 143.3 | nm |
| B | 111.3 | nm |
| C | 411.0 | nm |
| D | 69.8 | nm |
| E | 24.9 | nm |
| F | 13.2 | nm |

The above results indicates that more desirable exposure results can be obtained in an exposure apparatus that causes MSD, by adjustment of exposure condition or mask pattern in the light of the MSD.

In the present exemplary embodiment, an exposure condition and a mask pattern are put into a function. However, it is not essential. For example, a plurality of exposure conditions and a plurality of mask patterns may be prepared in advance, so that a combination thereof can be selected as desired.

In a second exemplary embodiment, a shape of effective light source and a mask pattern are obtained, which are suitable to exposure in a plurality of exposure apparatuses that cause MSD equal to or less than a predetermined value. The second exemplary embodiment is similar to the first exemplary embodiment, and thereby only the difference is described below. The second exemplary embodiment differs from the first exemplary embodiment in the definition of an evaluation amount in step S103.

In the present exemplary embodiment, the evaluation amount is defined as the root mean square (RMS) of shift amounts of LW1, LW2, and Gap from respective target values under the three exposures at a standard dose of exposure and the standard ±5% dose of exposure, and is calculated in both of the cases where $\sigma_x=\sigma_y=0$ nm and $\sigma_x=\sigma_y=10$ nm. In the present exemplary embodiment, the calculation is performed for two cases with $(\sigma_x, \sigma_y)=(0$ nm, 0 nm$)$ and $(\sigma_x, \sigma_y)=(10$ nm, 10 nm$)$, but may be performed for three or more cases, or for the case where $\sigma_x \neq \sigma_y$. In the latter case where $\sigma_x \neq \sigma_y$, the adjustment is more effective because any change in dose of exposure or focus hardly improves the exposure result.

Figure 7A:
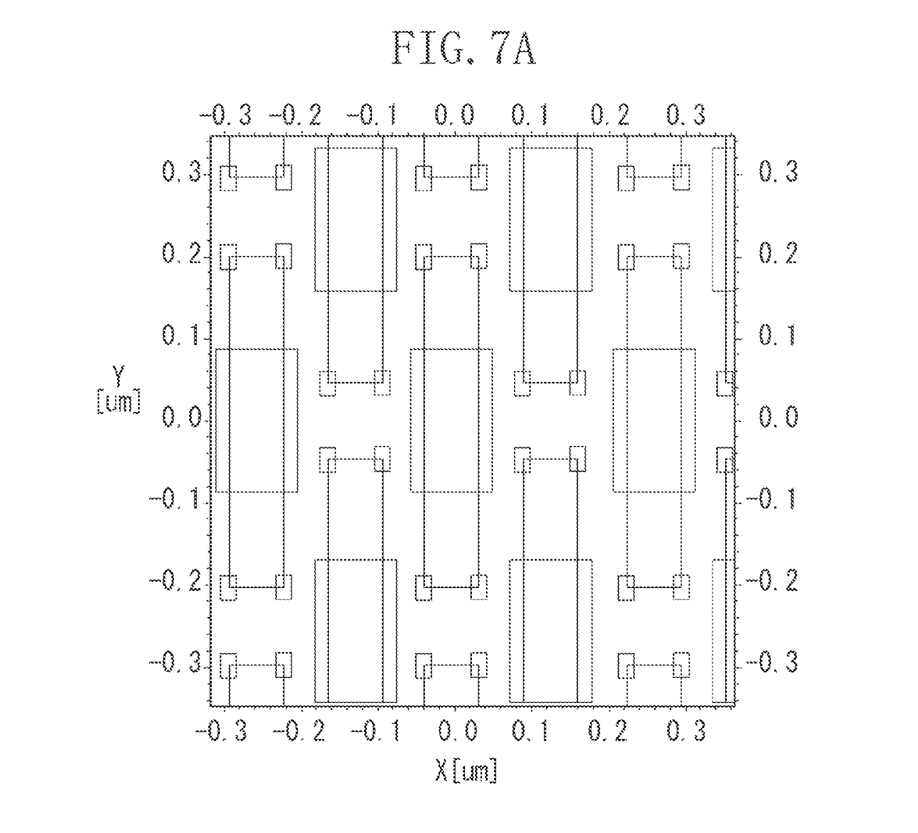
FIG. 7A illustrates a result of adjustment of mask patterns in a second exemplary embodiment.
Figure 7B:
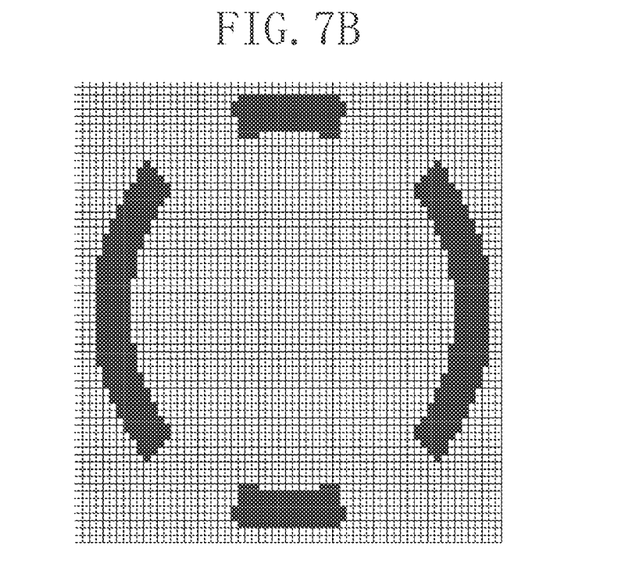
FIG. 7B illustrates an adjustment result of the shape of effective light source in the second exemplary embodiment.
Figure 7C:
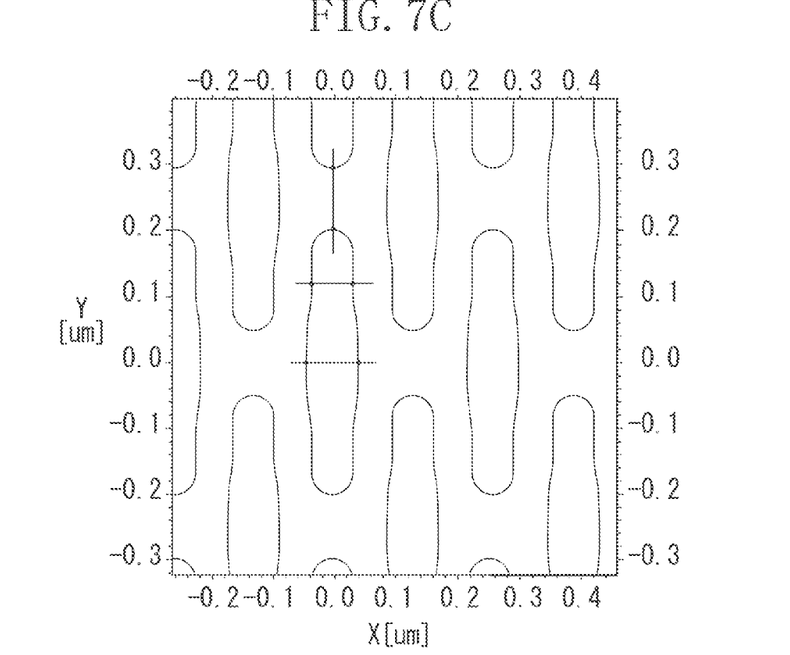
FIG. 7C illustrates an image formed without micro vibrations in the second exemplary embodiment.
Figure 7D:
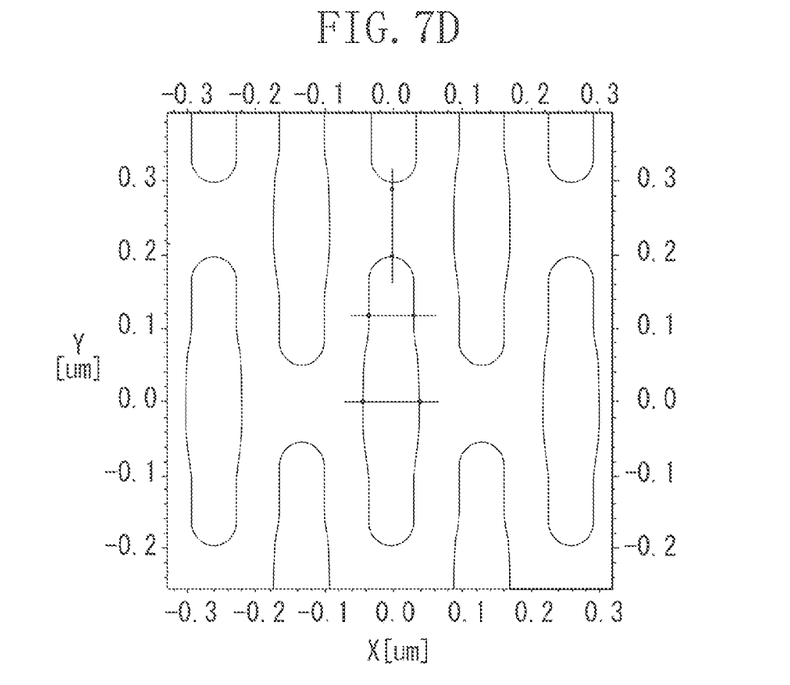
FIG. 7D illustrates an image formed under micro vibrations in the second exemplary embodiment.

The results obtained by the above method are as follows. FIG. 7A illustrates the mask pattern obtained by the method, FIG. 7B illustrates the shape of effective light source obtained by the method, and FIG. 7C illustrates an image obtained under the standard dose of exposure where $\sigma_x=\sigma_y=0$ nm, and FIG. 7D illustrates an image obtained under the standard dose of exposure where $\sigma_x=\sigma_y=10$ nm. Table 3 lists the resulting variables after adjustment.

TABLE 3

| | | |
|---|---|---|
| $\Psi_1$ | 34.2 | degrees |
| $\Psi_2$ | 85.5 | degrees |
| $\sigma_a$ | 0.95 | |
| $\sigma_b$ | 0.78 | |
| A | 174.6 | nm |
| B | 107.4 | nm |
| C | 403.8 | nm |
| D | 70.0 | nm |

TABLE 3-continued

| | | |
|---|---|---|
| E | 30.0 | nm |
| F | 21.8 | nm |

In the case where $\sigma_x=\sigma_y=0$ nm, the RMS of an shift amount of evaluated dimensions from the target values under the three exposures at a standard dose of exposure and the standard ±5% dose of exposure was 3.1 nm. In the case where $\sigma_x=\sigma_y=10$ nm, the RMS of shift amounts of evaluated dimensions from the target values under the three exposures at a standard dose of exposure and the standard ±5% dose of exposure, was 3.4 nm.

For comparison, as a control example, the variables were adjusted without respect to MSD as in the prior art. Table 2 lists the resulting variables in this control example. In the case where $\sigma_x=\sigma_y=0$ nm, the RMS of shift amounts of evaluated dimensions from the target values under the three exposures at a standard dose of exposure and the ±5% standard dose of exposure was 2.8 nm. In the case where $\sigma_x=\sigma_y=10$ nm, the RMS of shift amounts of evaluated dimensions from the target values under the three exposures at a standard dose of exposure and the standard ±5% dose of exposure, was 4.2 nm.

The method in the prior art naturally provides satisfactory results in the case without MSD, but the results in the case with MSD get worse than those in the exemplary embodiments, which may seriously degrade device yield.

In the present exemplary embodiment, both of exposure condition and mask pattern are used as variables, but only one of them may be used. In the present exemplary embodiment, evaluation is performed under three different amounts of exposure, but the other number of doses may be used, and defocus may be taken into consideration.

In the present exemplary embodiment, the RMS of an shift amount of evaluated dimensions from the target values is used as an evaluation amount, but the maximum value among the absolute values of shift amounts of evaluated dimensions from the target values may be used, or the sum of the absolute values may be use instead. Alternatively, the evaluation amount may be the difference between the dimensions in the case where $(\sigma_x, \sigma_y)=(0$ nm, 0 nm$)$ and those in the case where $(\sigma_x, \sigma_y)=(10$ nm, 10 nm$)$. Moreover, the evaluation amount may be the product of each shift amount of an evaluated dimension and an individual weight value. Otherwise, the evaluation amount may be the image intensity at one or more points on an image or the gradient of the image intensity.

In the present exemplary embodiment, a shape of effective light source is used as a variable of the exposure condition, but the variable may be the intensity distribution of effective light source, the polarization state of effective light source, the NA of projection optical system, the pupil function of projection optical system, or the wavelength distribution of illumination light. An optical image is used in the present exemplary embodiment, but a resist image or an etched image may be used. In this case, any parameter of resist model or etching model may be used as a variable. In the present exemplary embodiment, the shape of mask pattern is used as a variable, but the transmittance or phase of the mask pattern may be used as a variable. Alternatively, the position or dimension of an unresolved auxiliary (assist) pattern may be used as a variable. Each dose of exposure may be used as a variable when multiple exposures are performed.

In the present exemplary embodiment, micro vibrations of a stage for supporting a mask or a stage for supporting a substrate, or asynchrony of scanning are taken into consideration, but vibrations of a projection optical system or vibrations of an illumination optical system may be considered.

More desirably, these vibrations and asynchronous in total should be recognized as the MSD.

In the present exemplary embodiment, formation of blurred image due to the MSD is described, but there are other factors that make images blurred, which can be taken into consideration. For example, when the distortion at a single point on a substrate changes while the point is exposed, the formed images get shifted and partially superimposed upon each other, resulting in formation of a blurred image. In this case also, adjustment of exposure condition or mask pattern is applicable to prevent the blurred image. In the case of scanning exposure, a point on a substrate is exposed through a linear image area in the scanning direction of a projection optical system, and if a distortion on the area is not constant, the forming images get shifted and superimposed upon one another, resulting in formation of a similar blurred image. In this case also, the same measures can be taken.

In the present exemplary embodiment, the common adjustment of exposure condition or mask pattern could be applied to a plurality of exposure apparatuses that have different MSD. However, a similar method can be applied to one exposure apparatus. For example, in the case of scanning exposure, distortions differ according to the exposure areas of a projection optical system. In other words, if a screen area for exposure of a point on a substrate has almost no distortion in a projection optical system, and another area for exposure of another point on a substrate has relatively large distortion in the projection optical system, the images formed on the two points have different blurs due to the different distortions. This situation corresponds to the simultaneous presence of a plurality of MSDs in a single exposure apparatus. In this situation also, adjustment of exposure condition or mask pattern for the two points (states) is performed using the same method as in the present exemplary embodiment. Obviously, the adjustment is similarly effective to three or more points (three states).

In the case of scanning exposure, the MSD generally depends on a speed of scanning. Accordingly, if exposure is performed, for some reason, at a plurality of scanning speeds in one exposure apparatus, a plurality of MSDs may occur. The present invention is also effective in this situation.

As described above, the present invention provides: a desirable method and a desirable program for determining at least one of exposure condition and mask pattern in an exposure apparatus that causes lateral shift of images during exposure; and a storage medium storing the program.

A method of manufacturing a device (e.g., semiconductor IC device, liquid crystal display element) using the above exposure apparatus is described. First, at least one of exposure condition and mask pattern is determined using the above describe determining method. When a mask pattern is determined, a mask having the mask pattern is manufactured. Then, the above exposure apparatus is used to expose a substrate (e.g., wafers, glass substrates) having a photosensitive material coated thereon, based on the determined exposure condition and using the manufactured mask. After the substrate (photosensitive material) is developed, other known processes (e.g., etching, resist stripping, dicing, bonding, packaging) are performed to manufacture the device. Present exemplary device manufacturing method enables production of high quality devices compared with conventional method.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2010-039071 filed Feb. 24, 2010, which is hereby incorporated by reference herein in its entirety.

What is claimed is:

1. A non-transitory computer readable storage medium storing a computer-executable program for causing a computer to determine at least one of mask pattern and exposure condition of an exposure apparatus having an illumination optical system for illuminating a mask with light from a light source and a projection optical system for projecting an image of the mask pattern onto a substrate,
wherein the program causes the computer to perform the following steps:
setting a parameter about at least one of the mask pattern and the exposure condition;
setting information to define an image blur of the mask pattern formed at a single point on the substrate so as to superimpose a plurality of laterally shifted images of the mask pattern upon one another at the single point by illuminating the mask and projecting the laterally shifted image of the mask pattern onto the single point on the substrate with scanning the mask and the substrate;
calculating the image of the mask pattern at the single point to be formed of the superimposed laterally-shifted images by projecting the laterally shifted image of the mask pattern onto the single point on the substrate with scanning the mask and the substrate under the exposure condition using the set parameter and the set information;
changing the set parameter;
calculating the image of the mask pattern at the single point to be formed of the superimposed laterally-shifted images using the changed parameter and the set information, after changing the set parameter;
repeating the step of changing the parameter and the step of calculating the image of the mask pattern to be formed of the superimposed laterally-shifted images using the changed parameter and the set information; and
determining at least one of the mask pattern and the exposure condition based on calculation results of the images obtained by repeating the step of changing the parameter and the step of calculating the image.

2. The storage medium according to claim 1, wherein the information about the lateral shift is a moving standard deviation of a stage holding a mask or a substrate.

3. The storage medium according to claim 1, wherein at least one parameter of the exposure condition and at least one parameter of the mask pattern are set, and
wherein the determination includes determination of the exposure condition and the mask pattern based on the calculation results.

4. The storage medium according to claim 3, wherein the mask pattern is composed of a combination of a plurality of polygons and a length of each side of the polygons is set as a parameter of the mask pattern.

5. The storage medium according to claim 1, wherein the information includes a plurality of setting values different from each other that define a magnitude of the lateral shift, and
wherein the calculation includes a calculation of the image of the mask pattern for each of the different setting values.

6. A method to determine at least one of mask pattern and exposure condition of an exposure apparatus having an illumination optical system for illuminating a mask with light from a light source and a projection optical system for projecting an image of the mask pattern onto a substrate, the method comprising:

setting a parameter about at least one of the mask pattern and the exposure condition;

setting information to define an image blur of the mask pattern formed at a single point on the substrate so as to superimpose a plurality of laterally shifted images of the mask pattern upon one another at the single point by illuminating the mask and projecting the laterally shifted image of the mask pattern onto the single point on the substrate with scanning the mask and the substrate;

calculating the image of the mask pattern at the single point to be formed of the superimposed laterally-shifted images by projecting the laterally shifted image of the mask pattern onto the single point on the substrate with scanning the mask and the substrate under the exposure condition using the set parameter and the set information;

changing the set parameter;

calculating the image of the mask pattern at the single point to be formed of the superimposed laterally-shifted images using the changed parameter and the set information, after changing the set parameter;

repeating the step of changing the parameter and the step of calculating the image of the mask pattern to be formed of the superimposed laterally-shifted images using the changed parameter and the set information; and determining at least one of the mask pattern and the exposure condition based on calculation results of the images obtained by repeating the step of changing the parameter and the step of calculating the image.

7. The method according to claim 6, wherein the information includes information about vibration of a stage configured to move the mask or a stage configured to move the substrate.

8. The method according to claim 6, wherein the information includes information about asynchronous of a stage configured to move the mask and a stage configured to move the substrate.

9. The method according to claim 6, wherein the information includes information about distortion that changes while the substrate is being exposed.

10. The method according to claim 6,
wherein the information includes a value a of Gaussian function, and
wherein, in the calculating, the image formed such that plural images are superimposed on one another is calculated by convolution of an image of a pattern on an object plane of the projection optical system without the lateral shift of an image with the Gaussian function, using the value $\sigma$ of Gaussian function.

11. The method according to claim 10, wherein the value $\sigma$ of Gaussian function is different in directions perpendicular to each other in which the image is laterally shifted.

12. An information processing apparatus for determining at least one of mask pattern and exposure condition of an exposure apparatus having an illumination optical system for illuminating a mask with light from a light source and a projection optical system for projecting an image of the mask pattern onto a substrate, the apparatus comprising:

a processor configured to perform the steps of:

setting a parameter about at least one of the mask pattern and the exposure condition;

setting information to define an image blur of the mask pattern formed at a single point on the substrate so as to superimpose a plurality of laterally shifted images of the mask pattern upon one another at the single point by illuminating the mask and projecting the laterally shifted image of the mask pattern onto the single point on the substrate with scanning the mask and the substrate;

calculating the image of the mask pattern at the single point to be formed of the superimposed laterally-shifted images by projecting the laterally shifted image of the mask pattern onto the single point on the substrate with scanning the mask and the substrate under the exposure condition using the set parameter and the set information;

changing the set parameter;

calculating the image of the mask pattern at the single point to be formed of the superimposed laterally-shifted images using the changed parameter and the set information, after changing the set parameter;

repeating the step of changing the parameter and the step of calculating the image of the mask pattern to be formed of the superimposed laterally-shifted images using the changed parameter and the set information; and determining at least one of the mask pattern and the exposure condition based on calculation results of the images obtained by repeating the step of changing the parameter and the step of calculating the image.

* * * * *